United States Patent [19]

Waibel et al.

[11] Patent Number: 5,405,704
[45] Date of Patent: Apr. 11, 1995

[54] CERAMIC PLATE (SUBSTRATE) WHICH IS COATED WITH METAL AT LEAST ON ONE SIDE

[75] Inventors: Brigitte Waibel, Pforzheim; Wolfram Martin, Birkenfeld; Hans-Joachim Bunge, Clausthal-Zellerfeld, all of Germany

[73] Assignees: Doduco GmbH & Co.; Eugen Dürrwälchter, both of Pforzheim, Germany

[21] Appl. No.: 924,402

[22] Filed: Aug. 3, 1992

Related U.S. Application Data

[63] Continuation of Ser. No. 613,484, Oct. 29, 1990, abandoned.

[30] Foreign Application Priority Data

Apr. 29, 1988 [DE] Germany ............ 38 14 486.7

[51] Int. Cl.6 ............ B32B 15/00; C04B 41/88
[52] U.S. Cl. ............ 428/472; 428/209; 428/699; 428/701; 428/702
[58] Field of Search ............ 428/469, 472, 409, 209, 428/699, 701, 702

[56] References Cited

U.S. PATENT DOCUMENTS 4,659,606  4/1987  Wada et al. .................. 428/336
4,808,463  2/1989  Yoshikatsa et al. .......... 428/433

OTHER PUBLICATIONS

Wittmer et al "Mechanical Properties of Liquid-phase bonded copper-ceramic substrates" Jour. of The Amer. Ceramic Soce. vol. 65, No. 3, Mar. 1982.
Nakada et al "Surface texture formation of $Al_2O_3$ Substrates" Journ. of the Amer. Ceramic Soce. vol. 58, No. 9-10, Sep./Oct. 1975.

*Primary Examiner*—A. A. Turner
*Attorney, Agent, or Firm*—Dvorak and Traub

[57] ABSTRACT

Ceramic plates are described, which are coated with metal at least on one side and suitably on both sides and have an improved resistance to cyclic temperature changes because a ceramic material is used which has a texture that is as low as possible.

4 Claims, 1 Drawing Sheet

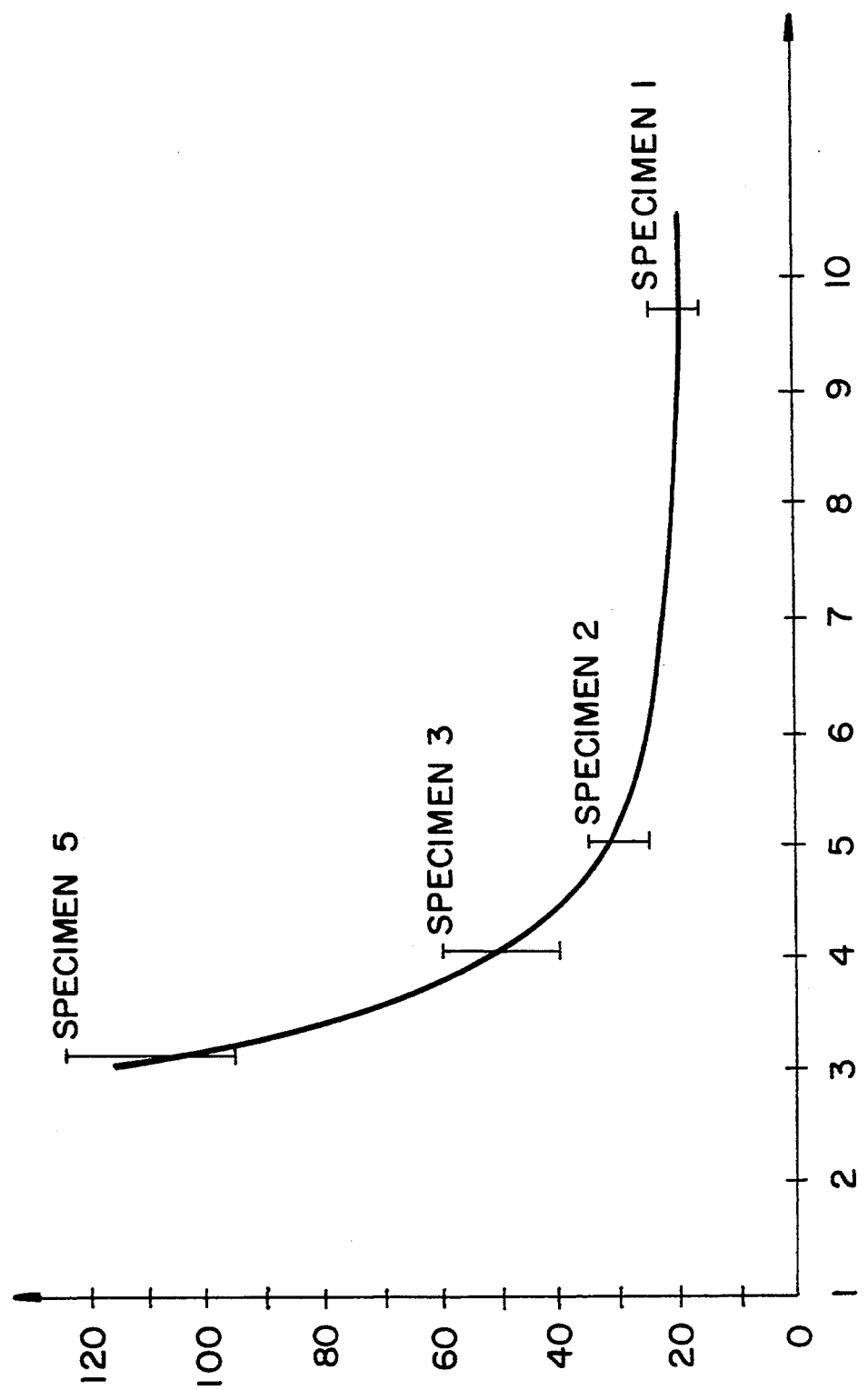

CERAMIC PLATE (SUBSTRATE) WHICH IS COATED WITH METAL AT LEAST ON ONE SIDE

This application is a continuation of application Ser. No. 07/613,484 filed Oct. 29, 1990 now abandoned.

BACKGROUND OF THE INVENTION

This invention relates to a ceramic plate which is coated with metal at least on one side, particularly to such plate which consists of a material having a hexagonal crystal structure. A conventional ceramic material having a hexagonal crystal structure is alumina.

The plates of alumina which are covered with a metal plate at least on one side and particularly on both sides are used, e.g., as heat sinks for electronic power components. For use under certain conditions, e.g., in igniting devices for spark ignition engines for automobiles, the metal-coated ceramic plates are required to have a high resistance to cyclic temperature changes. Owing to the different coefficients of expansion of the ceramic material and of the metal, temperature cycles will result in tensile and compressive stresses in alternation in the ceramic plate in a direction which is parallel to its metal-coated surface. In case of an inadequate resistance to cyclic temperature changes, the temperature cycles may result in a fracture in the ceramic plate in a direction which is parallel to the surface of the plate (conchoidal fracture). The risk of such fracture will be particularly high if the ceramic material and the metal have highly different coefficients of expansion, as will particularly be the case if a metal having a high thermal conductivity, such as copper, is joined to the ceramic plate directly, without an interlayer consisting of a different metal or of a metal alloy. An interlayer having a high ductility, such as an interlayer consisting of a solder alloy, could compensate the resulting thermally induced stresses in part.

Journal of the American Ceramic Society, Vol. 58, No. 9–10, pages 409–412, September-October 1975, contains a disclosure of an $Al_2O_3$ substrate, which has a relative degree of texture of 0 to 3 measured in the 006-pole figure. In contrast to the present specification, however, the relative degree of texture as given in said publication is defined as the ratio of the relative degrees of texture in the 006- and 113- pole figures. It has also been disclosed that the sintering temperature has an influence on the texture. Journal of the American Ceramic Society, Vol. 65, No. 5, pages 149–158, March 1982, contains a description of a metal-coated ceramic plate and its use in power electronics and states that the resistance of metal-coated ceramic plates to cyclic temperature changes is adversely affected by thermally induced stresses. It is stated there that the resistance to cyclic temperature changes is to be improved by the selection of a special coating process.

BRIEF DESCRIPTION OF THE DRAWINGS

FIG. 1 is a graphical representation of temperature cycles versus relative degree of texture.

DETAILED DESCRIPTION OF THE INVENTION

It is the object of the invention to improve the resistance of ceramic plates (substrates) of the kind described first hereinbefore to cyclic temperature changes.

For ceramic plates made of a material having a hexagonal crystal structure that object is accomplished by the features recited in claim 1.

The inventors have found that thin ceramic plates will have a more or less pronounced texture in dependence on their production process and that the resistance or such ceramic plate which is coated with metal at least on one side and particularly on both sides to cyclic temperature changes will be the better the less the texture of the ceramic material is pronounced. The highest resistance to cyclic temperature changes will be obtained if the material has no texture at all, i.e., if its crystals have a perfectly random orientation. The technical teaching of this patent furnishes those skilled in the art with a rule for the selection of the ceramic plates. If a ceramic material is employed which has a hexagonal crystal structure—examples are alumina and aluminum nitride—the ceramic plate should be made of a material in which the relative degree of texture in the 006-pole figure is less than 5. In the example alumina the relative degree of texture in the 006-pole figure should suitably be less than 4.5, preferably less than 5. The best result regarding the resistance to cyclic temperature changes may be expected by those in the art if the selected ceramic has a texture which is as low as is technologically possible; in an ideal case the ceramic has no texture at all.

Methods by which the texture can be analyzed and numerically determined are known to those skilled in the art. A survey is furnished by H. J. Bunge in his publication "Three dimensional texture analysis", International Materials Reviews 1987, Vol. 32, No. 6, 265-291. The following remarks are made here to permit an understanding of texture analysis.

A material has a crystallographic tecture if the crystals of which the material is composed do not have a random orientation but a preferred orientation. The orientation of a single crystallite in a sample of the material is determined by the rotation g which is required to move the system of coordinates of the crystal axes of the crystallite into coincidence with the system of coordinates of the sample. If the sample consists of a plate, as in the present case, the selected system of coordinates of the plate suitably consists of the longitudinal direction, transverse direction and normal direction of the plate. The rotation g is determined by three angles, preferably by three Euler angles $\phi_1$, $\phi$, $\phi_2$. In that case the texture is defined as the frequency distribution (orientation distribution function (ODF)) of the crystallites as regards their crystallographic orientation ($\phi_1$, $\phi$, $\phi_2$).

The texture is mainly measured by X-ray diffraction; in special cases, neutron diffraction and electron diffraction are employed and the spatial distribution of the angles of individual selected crystal directions is measured. Said distributions of angles are called pole figures. A single pole figure will not completely describe the texture because it will depend on only two of three orientation parameters; the pole figure is merely a two-dimensional projection of the spatial (three-dimensional) frequency distribution of the crystallites or of their crystallographic orientation. The spatial (three-dimensional) frequency distribution of the crystallographic orientations in the sample, i.e., the complete orientation distribution function (ODF), can be calculated from a plurality of different two-dimensional projections of the frequency distribution, i.e., from a plurality of different pole figures. The calculation is performed in accordance with the mathematical method of pole figure inversion.

Any desired pole figures can be caluculated by the orientation distribution function (ODF) and may include also pole figures which can be measured only with difficulty or cannot be measured at all because the associated reflex in the X-ray diffraction diagram has only a low intensity. This invention is concerned with materials which have a hexagonal crystal structure and in which this is true, e.g., for the base reflex (006), i.e., for the diffraction of X-rays at those planes of the crystal lattice which are designated with the Miller indices (006). For this reason the (006)-pole figure, also called basal pole figure, can be radiographically measured but it can also be calculated by an analysis of the orientation distribution function (ODF) from the other measurable pole figures particularly from the six pole figures (012), (104), (110), (113), (116) and (024). Attention is directed in that connection to the above-mentioned publication by H.-J. Bunge.

In the present case the texture is related to the orientation of the hexagonal basal face of the crystallites in the material having a hexagonal crystal structure because that crystallographic basal face has been found to be preferentially parallel to the substrate surface. For this reason the degree of texture is indicated in the present case as the relative intensity at the maximum of the frequency distribution of the crystallites in the (006)-pole figure and is stated as the relative degree of texture because the intensity at the maximum of the frequency distribution is expressed as a multiple of the intensity obtained in case of a random orientation. For this reason the relative degree of texture apparent from the (006)-pole figure indicates the factor by which the (006)-basal face of the crystallites is more frequently found at the maximum of the orientation distribution than in case of a random orientation, i.e., in a material having no texture. In a drawing, the degree of texture can be represented in a stereographic projection. In such a spherical projection the position of a certain crystallographic face, which can be selected as desired, is the variable which is represented. In the present case that is the hexagonal basal face. But in a spherical projection the selected crystallographic faces are not represented as such but by their normals, which are called "face poles". To provide the representation each crystallite which is to be examined as regards its orientation is imagined to be arranged at the center of a sphere and the normal (the face pole) of that crystallographic face for which the orientation is to be detected is represented in the equatorial plane of the sphere irk that the point at which the normal intersects the surface of the sphere is connected to the south pole of the sphere. The pole figure is constituted by the image of the normal (face pole) of the selected crystal face (which in the present case is the hexagonal basal face) of all crystallites of a plate. From the pole figure the preferred direction of the orientation of the face poles is apparent because the density or frequency of the points which constitute the pole figure has a maximum in the pole figure at a point which is characteristic for the plate. The numerical value of the relative degree of texture is obtained in that that maximum is found in the pole figure and the intensity at the location of that maximum, for which intensity the density and/or frequency of the points of the represented face poles is a measure, is compared with the density and/or frequency of points which have been determined by the representation of the corresponding face poles of a plate which has the same composition but no texture, at the same location of the equatorial plane; in other words: the relative degree of texture indicates the texture of a material and the degree of texture is normalized for an entirely random distribution of the crystallites amounting to 1.

The inventors have recognized that the resistance of ceramic plates made of a material having a hexagonal crystal structure to cyclic temperature changes can substantially be improved if the degree of texture is not in excess of predetermined limits. The relationship of the resistance to cyclic temperature change, and the degree of textures will be discussed hereinafter with reference to some results of experiments:

Alumina ceramic plates having the dimensions

| length | 23.2 mm |
| width | 13.2 mm |
| thickness | 0.635 mm | were coated by the "direct bonding" process with copper plates having the dimensions

| length | 21.0 mm |
| width | 11.0 mm |
| thickness | 0.65 mm |

A substantial number of specimens was subjected to cyclic temperature changes between −40° C. and +110° C. The specimens were held at the lower temperature and at the upper temperature for 40 minutes in each cycle and were rearranged between the lower and upper temperatures for a rearrangement time not in excess of 10 seconds. It was determined how many of such temperature cycles are withstood by each specimen until the ceramic plate breaks. The observed number of temperature cycles performed until a fracture of the ceramic occurs was related to the degree of texture of the ceramic plates, which had previously been determined from the (006)-pole figure (which in case of the examined alumina ceramic plates consists of concentric circles). The result is represented in the accompanying FIG. 1 by a curve in which the number of temperature cycles performed until a fracture of the ceramic occurs is plotted against the degree of texture. It is apparent that he resistance to cyclic temperature changes increases as the degree of texture decreases and that said increase is particularly pronounced below a relative degree of texture of 4.5 and at a relative degree of texture of 3.5 will result in a resistance to cyclic temperature changes which is four times that resistance of a plate having a pronounced texture (see sample 1 having a relative degree of texture of 9.75).

The samples designated 1 and 2 in FIG. 1 had relative degrees of texture of 9.75 and 5.05, respectively, and comprised alumina plates made by the foil-casting process. In that process, an aqueous slurry (slip) of an alumina powder is poured onto a moving belt end is dried by the action of heat to form a coherent strip. Plates are blanked from that strip and are stacked, weighted and sintered to form solid plates.

The samples designated 3 and 5 in FIG. 1 are made by the compacting rolling process, in which an alumina powder is mixed with a binder and is subsequently spray-dried and the dried powder is introduced into the roll nip of a rolling mill and is thus rolled to form a strip.

Plates are blanked from that strip and are stacked, weighted and sintered.

Investigations have shown that the compacting rolling process is a process which is suitable for the purposes of the invention. In another process which is suitable for the purposes of the invention for the production of ceramic plates having an improved resistance to cyclic temperature changes an alumina powder and a binder are mixed and dried, preferably by spray-drying, the dried powder is charged into a compression mold and is compacted therein to form plate blanks, which are subsequently consolidated by being sintered.

The invention is applicable not only to ceramic plates made of a material which has a hexagonal crystal structure but also to other ceramics, such as plates made of beryllium oxide, which has a cubic crystal structure.

We claim:

1. A ceramic plate substrate which consists of a material having a hexagonal crystal structure and is coated with metal at least on one side, said metal coated side being used for carrying electronic power components, characterized in that a metal-coated ceramic plate with improved resistance against cyclic temperature changes is formed by selecting and coating such a ceramic plate that has a relative degree of texture of the ceramic in the (006)-pole figure of less than 5.

2. A plate according to claim 1, characterized in that the ceramic material is alumina and the relative degree of texture in the (006)-pole figure is less than 4.5.

3. A ceramic plate substrate, which is coated with metal at least on one side, characterized in that the crystallites of the ceramic material have a random orientation.

4. A plate according to claim 1, characterized in that the ceramic material is alumina and the relative degree of texture in the (006)-pole figure is less than 3.5.

* * * * *